(12) United States Patent
Lin

(10) Patent No.: US 8,477,484 B2
(45) Date of Patent: Jul. 2, 2013

(54) ELECTRONIC APPARATUS WITH EMI SHIELDING STRUCTURE

(75) Inventor: Chih-Hao Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 186 days.

(21) Appl. No.: 13/205,623

(22) Filed: Aug. 9, 2011

(65) Prior Publication Data
US 2012/0229963 A1 Sep. 13, 2012

(30) Foreign Application Priority Data
Mar. 7, 2011 (TW) ................................. 100107482

(51) Int. Cl.
*G06F 1/16* (2006.01)

(52) U.S. Cl.
USPC .... 361/679.01; 349/167; 348/375; 312/140.2

(58) Field of Classification Search
USPC ............... 345/214, 76, 173, 60, 204, 78, 168, 345/170; 349/113, 137, 114, 149, 155, 150, 349/100, 167; 348/373, 335, 375; 361/679.21, 361/679.4, 679.01, 679.31, 679.55, 679.27, 679.41, 679.09, 679.28, 679.58, 679.08, 679.26, 679.48, 679.23, 679.38; 174/50, 520, 547, 174/564, 42, 255; 312/223.2, 276, 328, 140.2; 455/575.1, 575.3
See application file for complete search history.

(56) References Cited

U.S. PATENT DOCUMENTS

| | | | | |
|---|---|---|---|---|
| 2009/0322277 A1* | 12/2009 | Cargin et al. | ................. | 320/106 |
| 2011/0275087 A1* | 11/2011 | Breidenthal et al. | ......... | 435/6.12 |
| 2013/0027890 A1* | 1/2013 | Berger et al. | ................. | 361/747 |

* cited by examiner

*Primary Examiner* — Hung Duong
(74) *Attorney, Agent, or Firm* — Altis Law Group, Inc.

(57) ABSTRACT

An electronic apparatus includes a case having an opening, and at least one retaining section is adjacent to the opening. At least one retaining pin is arranged in each of the at least one retaining section. The electronic apparatus further includes a cover to cover the opening. The cover includes at least one fixing section engaging with the at least one retaining section. A receiving chamber is arranged in each of the at least one fixing section to receive a clamp section of a resilient piece clamping the at least one retaining pin. The resilient piece is movable when the retaining pin is clamped by the clamp section arranged in the receiving chamber.

11 Claims, 6 Drawing Sheets

ELECTRONIC APPARATUS WITH EMI SHIELDING STRUCTURE

BACKGROUND

1. Technical Field

The present disclosure relates to electronic apparatus, and particularly, to an electronic apparatus with Electromagnetic Interference (EMI) shielding structure.

2. Description of Related Art

Electromagnetic shielding is crucial for manufacturing electronic apparatuses. Dimension errors of different components may cause gaps when the electronic apparatus is assembled, and thus leads to EMI leakage.

Therefore, what is needed is an EMI shielding structure that overcomes the above-mentioned problem.

BRIEF DESCRIPTION OF THE DRAWINGS

The components in the drawings are not necessarily drawn to scale, the emphasis instead being placed upon clearly illustrating the principles of an EMI shielding apparatus. Moreover, in the drawings, like reference numerals designate corresponding parts throughout the several views.

DETAILED DESCRIPTION

Figure 1:
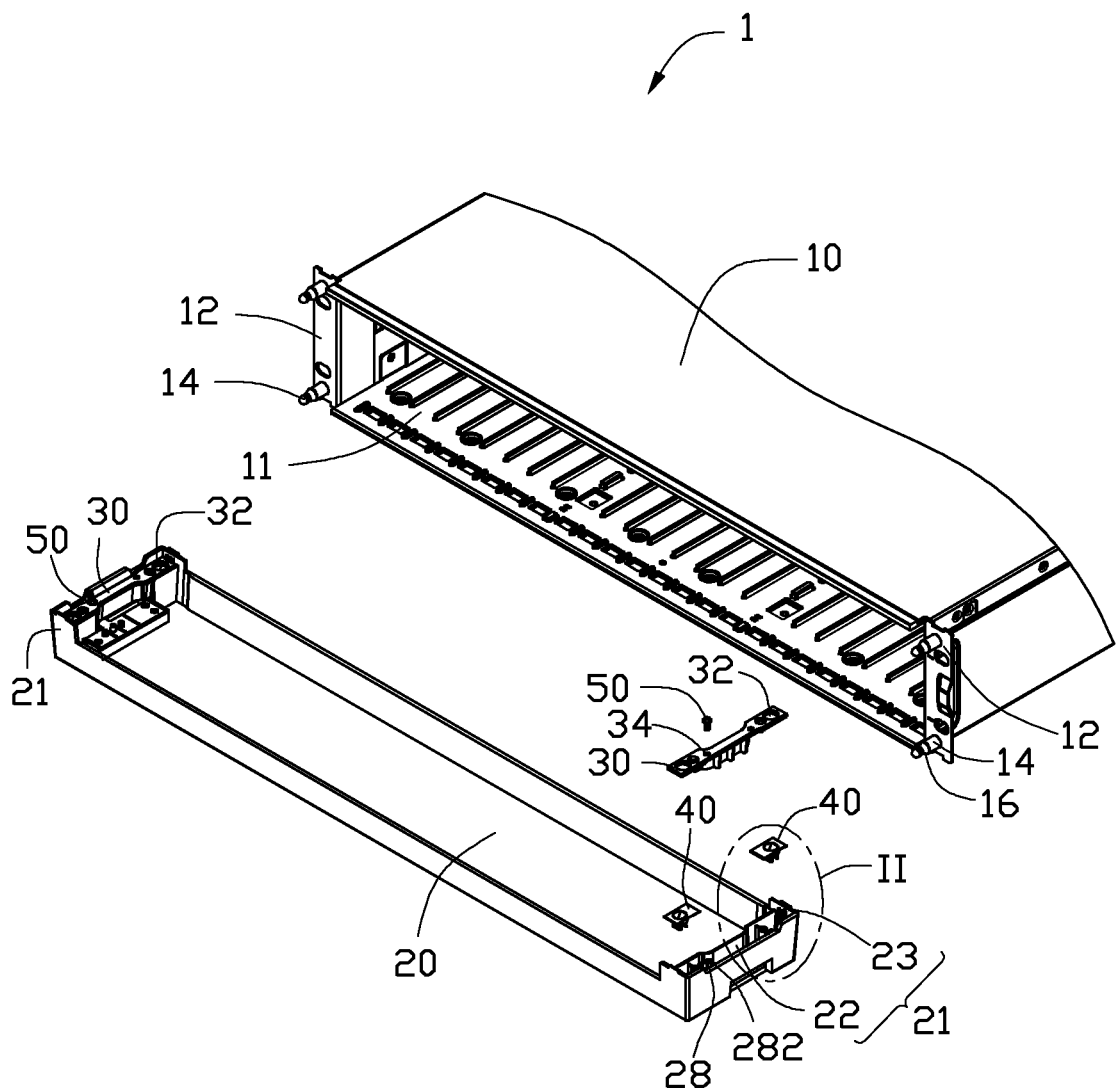
FIG. 1 is a partial, isometric, exploded view of an electronic apparatus with EMI shielding structure, in accordance with an exemplary embodiment.
Figure 2:
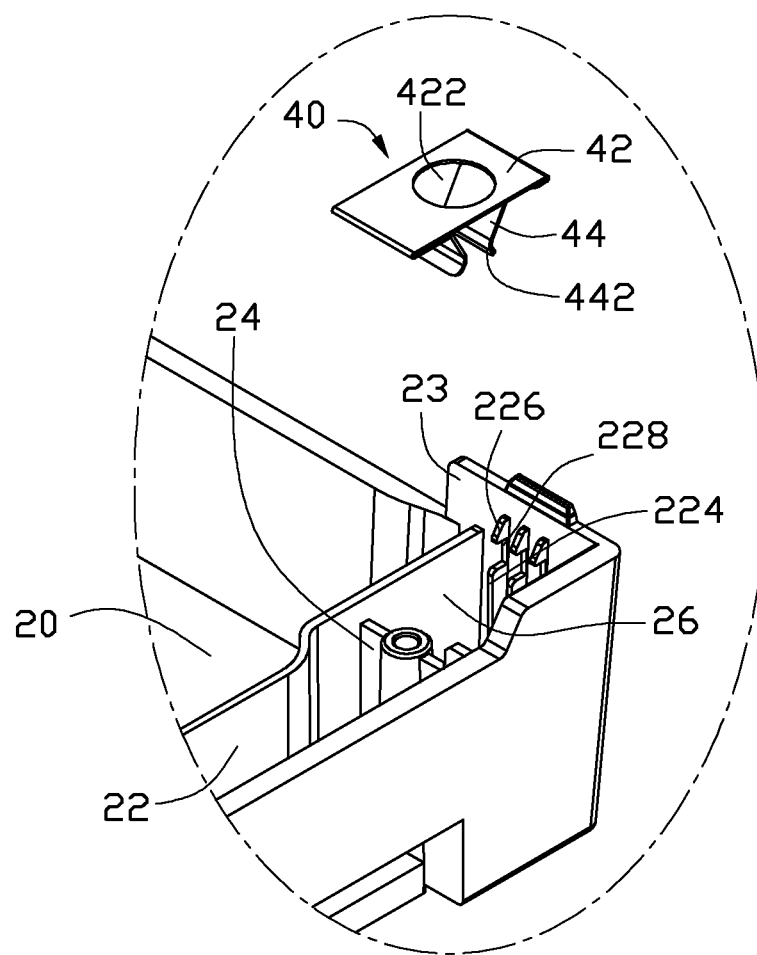
FIG. 2 is an enlarged view of circle II of FIG. 1.

Referring to FIG. 1-2, an electronic apparatus 1 includes a case 10, a cover 20, two fixing plates 30, and four resilient pieces 40; two of the four resilient pieces 40 correspond to one of the fixing plates 30, and the other two to the other fixing plate 30.

The case 10 has an opening 11 for installing hard drivers (not shown) therein. Two ends of the opening 11 are bent to form two retaining plates 12, and two retaining pins 14 protrude from each retaining plate 12; each retaining pin 14 has a securing groove 16.

The cover 20 can fix to the opening 11 to shield EMI, and two fixing sections 21 are formed on two ends of the cover 20 to respectively engage with the two fixing plates 30 of the case 10. Each fixing section 21 is formed by two opposing first side plates 22 and two opposing second side plates 23. Two supporting walls 24 are defined in parallel with the two second side plates 23, and a receiving chamber 26 for receiving the resilient piece 40 is formed between the supporting wall 24, the first side plates 22, and the second side plate 23. A convex stripe 224 and a hook 226 are arranged on each of the second side plates 23 and form a trough 228 between the convex stripe 224 and the hook 226. A mounting pillar 28 having a screw hole 282 therein is arranged between the two supporting walls 24.

Two first through holes 32 and a first fixing hole 34 are defined on each of the fixing plates 30, and correspond to the two retaining pins 14 of the retaining plate 12 and the screw hole 282 of the mounting pillar 28, respectively.

The resilient piece 40 includes a base plate 42 and two resilient arms 44 extending from the base plate 42 to form a clamp section 442 corresponding to the securing groove 16 of the retaining pin 14. A second through hole 422 is defined on the base plate 42 corresponding to the first through hole 32 of the fixing plate 30.

Figure 3:
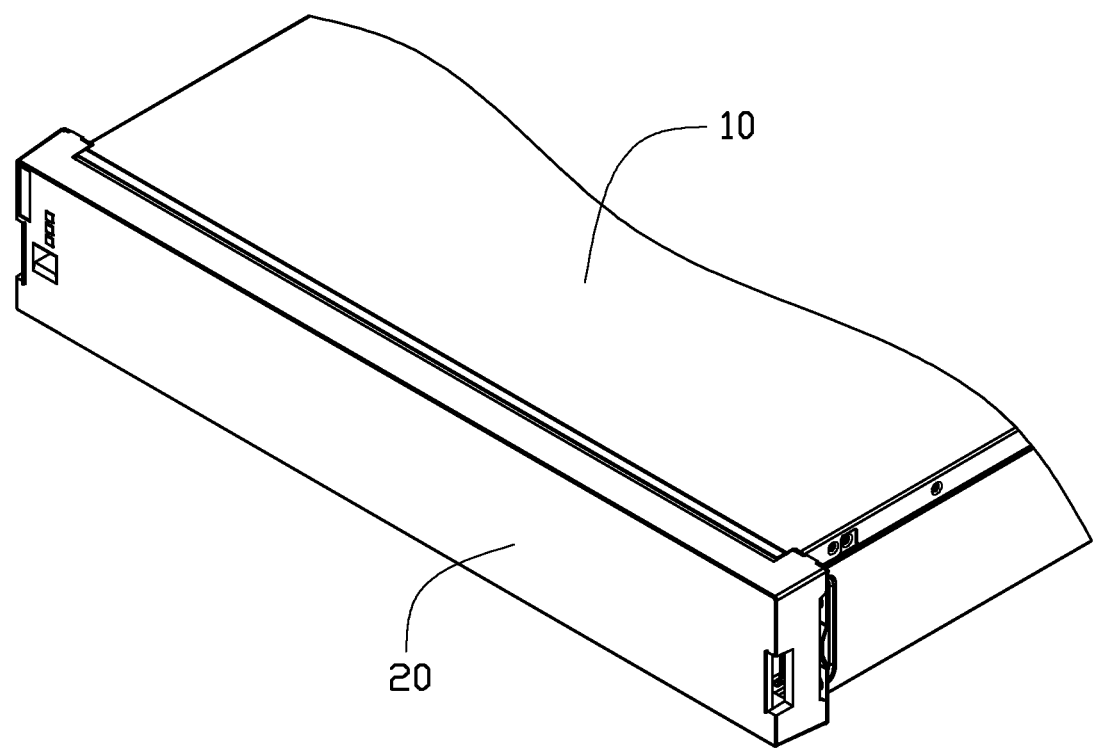
FIG. 3 is an isometric, assembled view of the apparatus of FIG. 1.
Figure 4:
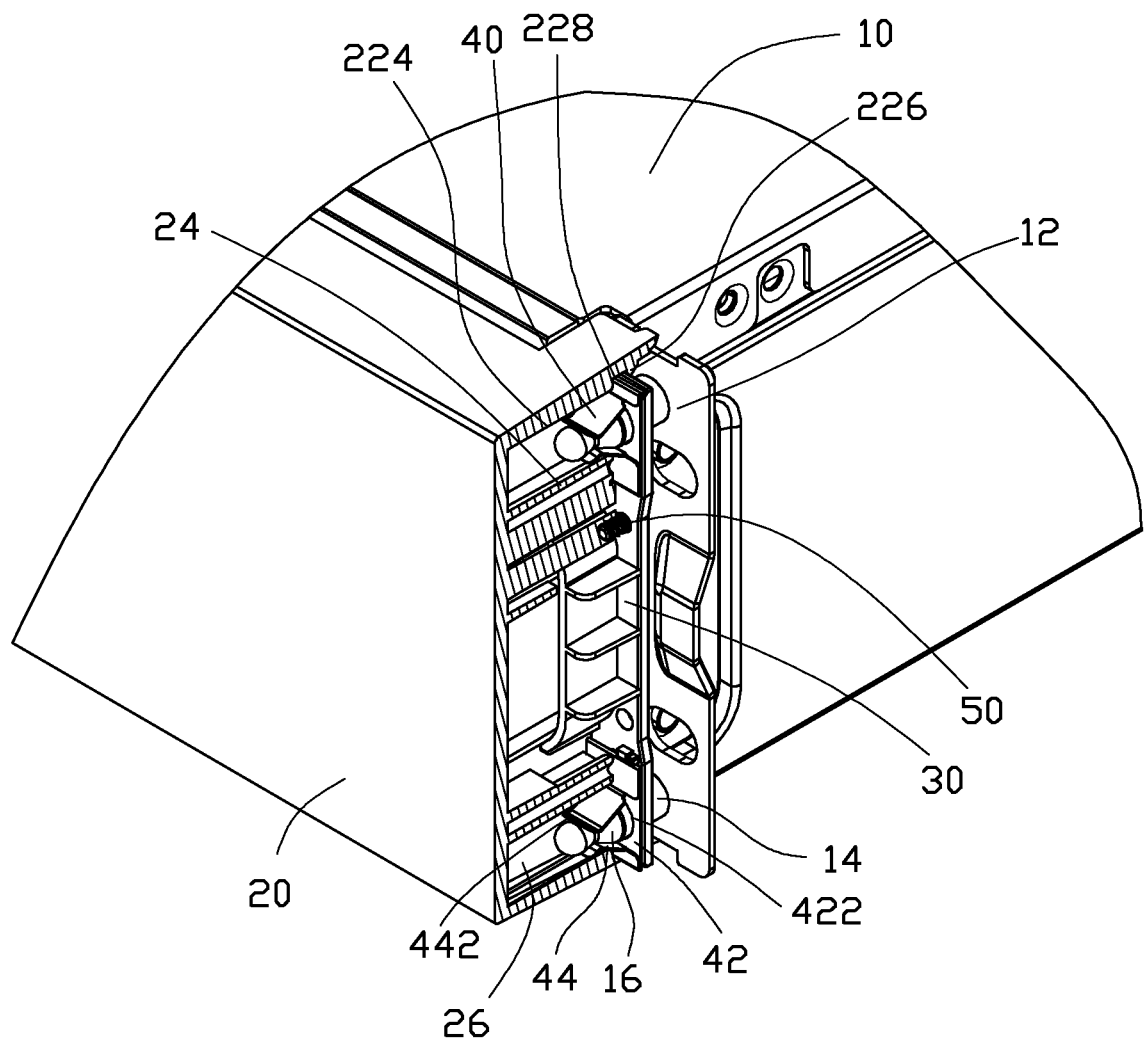
FIG. 4 is an isometric and cutaway view of the electronic apparatus of FIG. 1

Referring to FIG. 3-4, when assembled, the base plate 42 is arranged on the supporting wall 24 and the convex stripe 224, and the resilient arms 44 are arranged inside the receiving chamber 26. The fixing plate 30 is arranged on top of the base plate 42 of the resilient piece 40, and engaged to the trough 228 to be retained in the cover 20. The first through hole 32 of the fixing plate 30 corresponds to the second through hole 422 of the base plate 42, and the first fixing hole 34 corresponds to the screw hole 282 of the mounting pillar 28. The fixing plate 30 is fixed to the fixing section 21 with a screw 50 penetrating the first fixing hole 34 and the screw hole 282. The resilient pieces 40 are restricted between the fixing plate 30, the supporting walls 24, and the convex stripes 224. Gaps (not shown) are existed between the edge of the base plate 42 and the first side plates 22, and between the edge of the base plate 42 and the second side plates 23 to allow the resilient pieces 40 to move within a range so that the resilient arm 44 is still received inside the receiving chamber 26.

When the cover 20 is assembled to the case 10, the retaining pins 14 penetrate through the first through holes 32 and the second through holes 422, and the securing grooves 16 are clamped by the clamp section 442 to fix the cover 20 to the case 10. The position of the cover 20 can be adjusted to fit the opening 11 due to the gaps, and thus allowing the cover 20 to accurately seal the opening 11.

Figure 5:
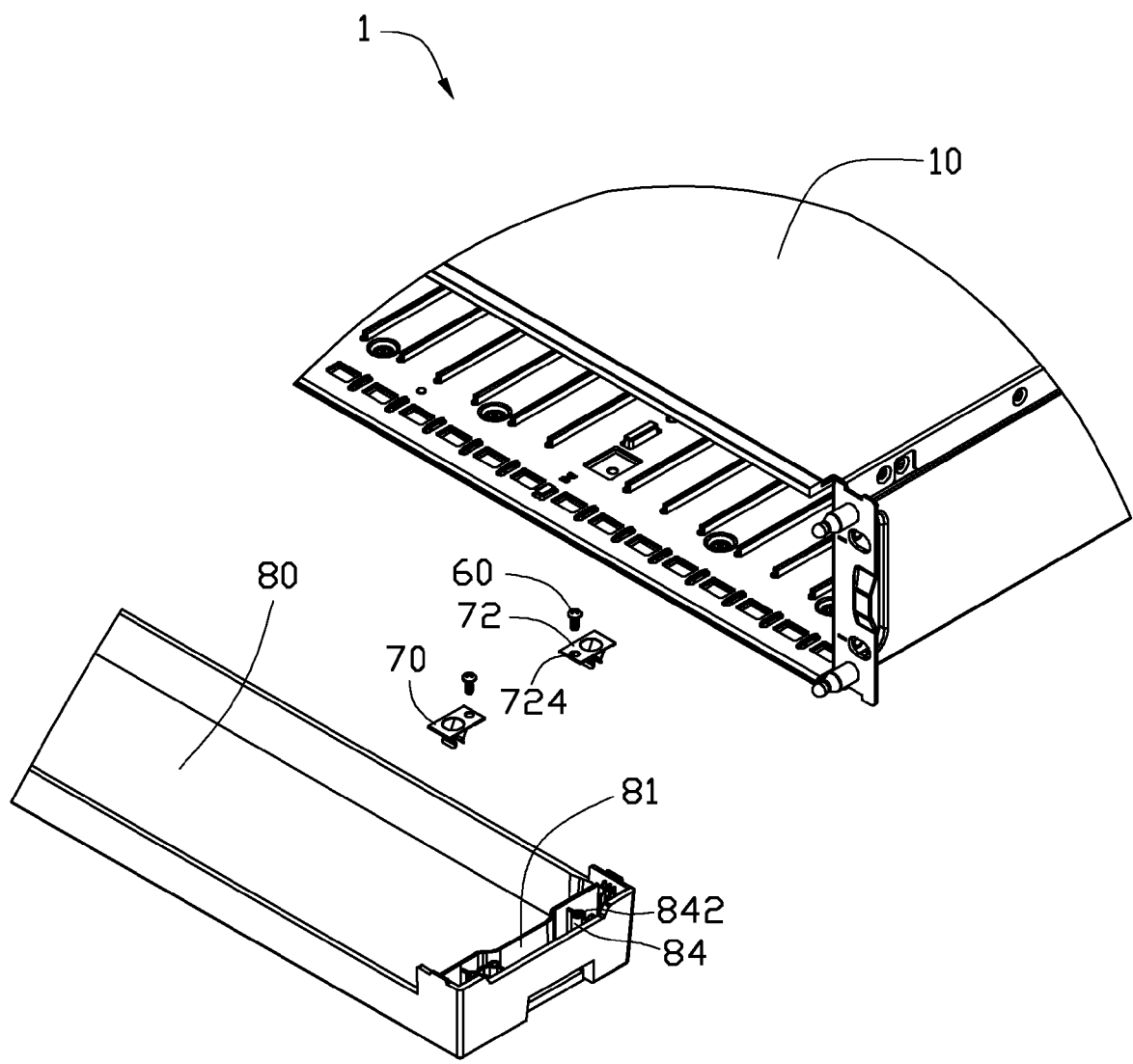
FIG. 5 is a partial, isometric, exploded view of an electronic apparatus, in accordance with another exemplary embodiment.
Figure 6:
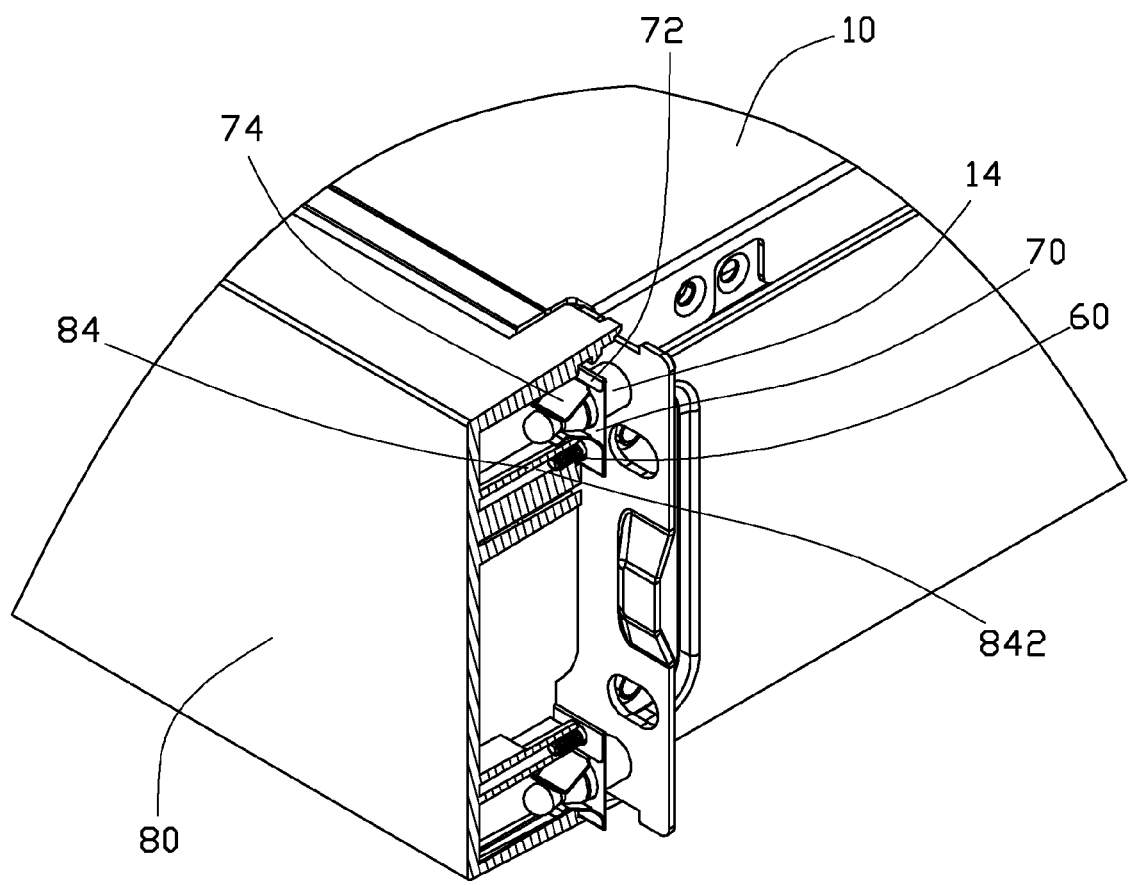
FIG. 6 is an isometric and cutaway view of the electronic apparatus of FIG. 5.

FIG. 5-6 show another embodiment of the present disclosure. Two resilient pieces 70 having resilient arms 74 are arranged on a fixing section 81 of a cover 80 with step screws 60. A second fixing hole 724 is defined on a base plate 72 of each resilient piece 70, and a shank (not shown) of the step screw 60 is smaller than the second fixing hole 724 to allow the resilient pieces 70 to move. The step screw 60 penetrates through the second fixing hole 724 of the resilient piece 70 and a mounting hole 842 on a mounting pillar 84 to mount the resilient piece 70 to the fixing section 81. The position of the cover 80 can be adjusted to fit the opening 11

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An electronic apparatus, comprising:
   a case comprising an opening, at least one retaining section adjacent to the opening, wherein at least one retaining pin is arranged in each of the at least one retaining section; and
   a cover to cover the opening, comprising at least one fixing section to engage the at least one retaining section; a receiving chamber being arranged in each of the at least one fixing section to receive a clamp section of a resilient piece clamping the at least one retaining pin; the resilient piece being movable when the retaining pin is clamped by the clamp section arranged in the receiving chamber.

2. The electronic apparatus as claimed in claim 1, wherein the resilient piece comprises a base plate; the at least one retaining pin penetrates through a first through hole on the base plate and is clamped by the clamp section; a supporting member protrudes from each of the at least one fixing section to support the base plate.

3. The electronic apparatus as claimed in claim 2, wherein a press member engaged with the at least one fixing section presses the base plate against the supporting member; a second through hole is defined on the press member; the at least one retaining pin penetrates the second through hole and the first through hole and clamped by the clamp section.

4. The electronic apparatus as claimed in claim 3, wherein the press member is engaged with a trough on side walls of each of the at least one fixing section.

5. The electronic apparatus as claimed in claim 4, wherein the trough is formed by concave stripes and hooks on the side walls.

6. The electronic apparatus as claimed in claim 3, wherein the press member is fixed to a mounting member protruded from each of the at least one fixing section; a mounting element penetrates through a fixing hole on the press member and fixes to a mounting hole on the mounting member.

7. The electronic apparatus as claimed in claim 6, wherein the mounting member is a mounting pillar.

8. The electronic apparatus as claimed in claim 3, wherein the supporting member is a supporting wall; the base plate is placed on the supporting wall and the resilient arms are received in the receiving chamber.

9. The electronic apparatus as claimed in claim 2, wherein the clamp section is two resilient arms extended from the base plate, and the resilient arms clamp a securing groove defined on the at least one retaining pin.

10. The electronic apparatus as claimed in claim 2, wherein the resilient piece is fixed to a mounting member protruded from each of the at least one fixing section; a mounting element penetrates through a fixing hole on the resilient piece and fixes to a mounting hole on the mounting member.

11. The electronic apparatus as claimed in claim 10, wherein the mounting element is a step screw, and the shank of the step screw is smaller than the fixing hole.

* * * * *